(12) United States Patent
Seema

(10) Patent No.: US 7,356,746 B2
(45) Date of Patent: Apr. 8, 2008

(54) EMBEDDED TESTING CIRCUIT FOR TESTING A DUAL PORT MEMORY

(75) Inventor: Jain Seema, Bangalore (IN)

(73) Assignee: Infineon Technologies AG, Munich (DE)

( * ) Notice: Subject to any disclaimer, the term of this patent is extended or adjusted under 35 U.S.C. 154(b) by 201 days.

(21) Appl. No.: 11/291,099

(22) Filed: Nov. 30, 2005

(65) Prior Publication Data

US 2007/0124629 A1 May 31, 2007

(51) Int. Cl.
*G01R 31/28* (2006.01)
(52) U.S. Cl. .................. 714/733; 714/718
(58) Field of Classification Search ........... 365/201; 714/718, 733, 711, 738, 728, 739
See application file for complete search history.

(56) References Cited

U.S. PATENT DOCUMENTS 5,535,164 A * 7/1996 Adams et al. ............. 365/201
6,070,256 A * 5/2000 Wu et al. .................. 714/718
6,360,344 B1 * 3/2002 Khoche et al. ............ 714/733
6,681,358 B1 * 1/2004 Karimi et al. ............. 714/733
6,853,597 B2 * 2/2005 Jain .......................... 365/201

* cited by examiner

*Primary Examiner*—David Ton
(74) *Attorney, Agent, or Firm*—Maginot, Moore & Beck

(57) ABSTRACT

A circuit tests a memory having a cell array accessible through first and second ports, the circuit comprising an address generation circuit for generating an internal address consisting of a row selection address and a column selection address in response to an external address consisting of a row selection address and a column selection address, wherein an adder generates the internal row selection address for addressing a second row of the cell array through the second port by incrementing the external row selection address for addressing a first row of the cell array through the first port, such that the first row and the second row form adjacent rows within the cell array, and a data generation circuit for generating internal test data responsive to external test data, wherein the external test data for the first port is inverted when the cell array is accessed through the second port.

18 Claims, 7 Drawing Sheets

FIG 3
Prior Art

| 0 0 0 1 0 0 1 1 0 1 0 1 1 1 1 0 0 0 0 | A(i) | i |
|---:|---:|---:|
| 0 0 0 0 | 0 | 0 |
| 1 0 0 0 | 8 | 1 |
| 1 1 0 0 | 12 | 2 |
| 1 1 1 0 | 14 | 3 |
| 1 1 1 1 | 15 | 4 |
| 0 1 1 1 | 7 | 5 |
| 1 0 1 1 | 11 | 6 |
| 0 1 0 1 | 5 | 7 |
| 1 0 1 0 | 10 | 8 |
| 1 1 0 1 | 13 | 9 |
| 0 1 1 0 | 6 | 10 |
| 0 0 1 1 | 3 | 11 |
| 1 0 0 1 | 9 | 12 |
| 0 1 0 0 | 4 | 13 |
| 0 0 1 0 | 2 | 14 |
| 0 0 0 1 | 1 | 15 |

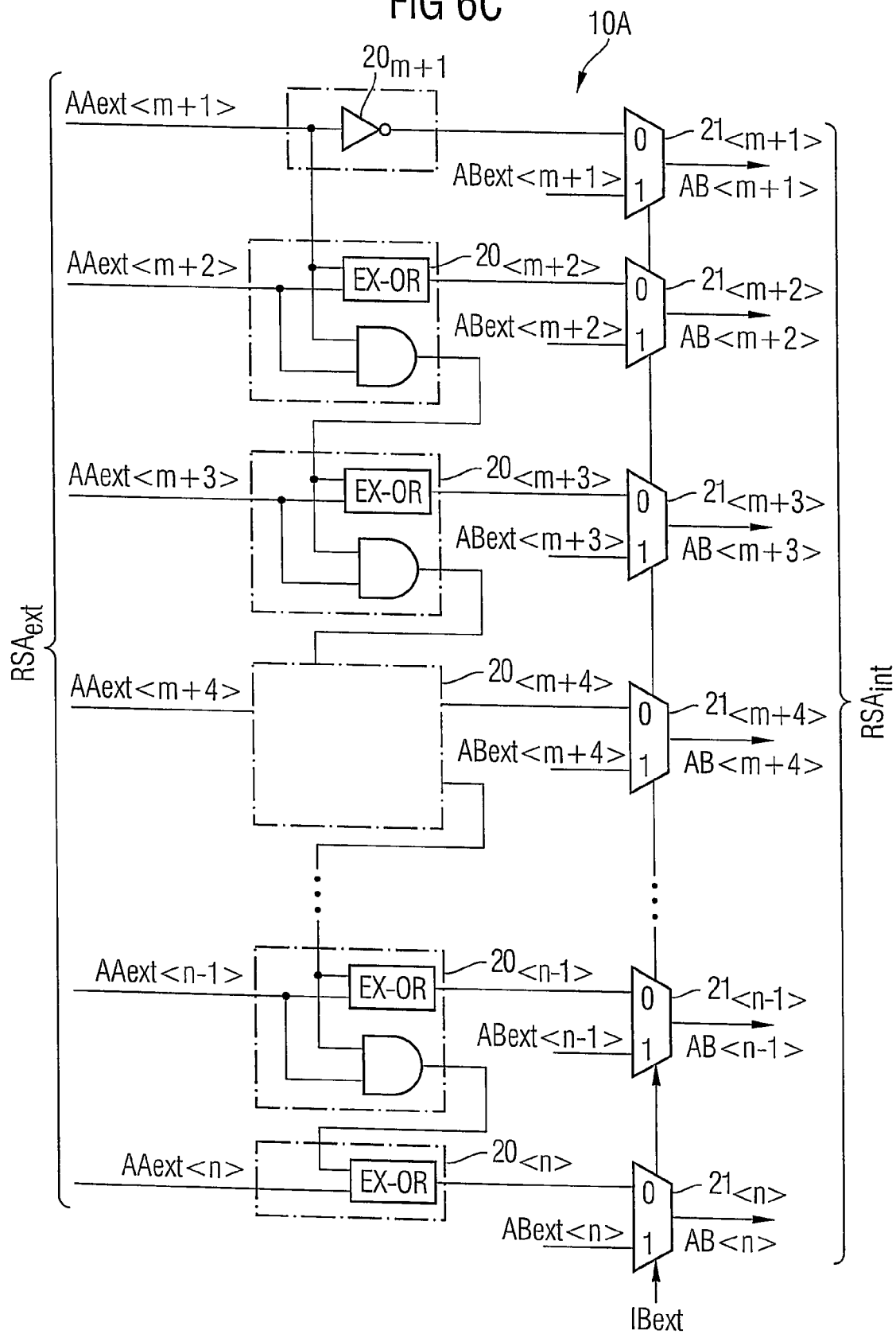

EMBEDDED TESTING CIRCUIT FOR TESTING A DUAL PORT MEMORY

BACKGROUND OF THE INVENTION

The invention relates to an embedded testing circuit for testing a dual port memory and to a method for testing a dual port memory.

A dual port memory is accessible through two separate ports. A conventional dual port random access memory consists of two ports which are designed to operate independently, giving flexibility of doing read and write operations from both ports simultaneously. However, it is prohibited to simultaneously write different values to the same address of the random access memory from both ports.

The testing of a dual port memory can be done by simply performing sequential read and write operations from both ports. To guarantee functionality of a dual port random access memory it is necessary to test whether the dual port memory is operable in any situation, and in particular, it is essential to do simultaneously read and write operations from both ports during the testing to ensure the functionality and performance of the dual port random access memory as it is required by the specification.

DRAMs and SRAMs differ little in their application. DRAMs are distinguished from SRAMs in that no bistable electronic circuits internal to the storage cell maintaining the information are provided. In DRAMs, the information is stored dynamically as charge on a capacitor. SRAMs maintain their bi-stability as long as power is supplied by a cross coupled pair of inverters within each memory cell. Two additional transistors serve to access internal nodes for reading and writing. In most designs, the storage cells are CMOS with two P-channel and four N-channel field effect transistors.

A dual port memory has an integrated memory cell array consisting of a plurality of memory cells arranged in a matrix and accessible via word lines and bit lines.

FIG. 1 shows a bit line structure in a dual port memory cell. The bit line BLA of port A, the bit lines BLB of port B and the inverted bit lines of both ports, $\overline{BLB}$ and $\overline{BLBA}$ are Shielded from each other by a line on a predetermined potential, such as VDD or ground, to reduce capacitive coupling between the bit lines. This is in particular important, since the size of the memory cells which are integrated is continuously shrinking. When data in one memory cell is inverted to that of another memory cell of the same column, both memory cells are accessed simultaneously from both ports, A, B a voltage difference between the bit line pair is reduced resulting in a slow read/write operation.

Testing of a dual port memory with an embedded testing circuit has been described in U.S. Pat. No. 5,579,322 as shown in FIG. 2. As can be seen from FIG. 2, the testing circuit is embedded in a conventional dual port memory RAM having two ports A, B. The testing circuit comprises a first group of scan registers (B1) and consists of serially connected plural stages of scan registers provided for each port at the address input side of the dual port memory. The testing circuit comprises an address generation circuit selectively supplying a predetermined address data pattern from one port side and the inverted address data pattern to the other port side. Accordingly, the address inputs to both ports A, B have a bit inverse relationship to each other at all times and consequently, the address inputs on both ports will not become identical at any time.

A second group of scan registers B2 is formed of serially connected plural stages of scan registers provided on each port at the data input side of the dual port memory RAM. The data generation circuit is provided for selectively supplying a predetermined test data pattern or the inverted test data pattern passed through one port side of the first group of scan registers to the second group of scan registers. Since the data written from port A and the data written form port B are always in a inverse relationship to each other, it is possible to write and read a logical "0" and a logical "1" from all addresses or from both ports, A and B.

At the data output side of the dual port RAM and the data input side there are arranged also three scan registers which are serially connected at their respective boards as a third group of scan registers corresponding to the output node.

Since the address input and the two ports, A, B have a bit inverse relationship at all times for all addresses it is not ensured that simultaneously a read/write operation is happening at the same column. Furthermore, a simultaneous selection of two adjacent rows for all memory cells is not possible.

FIG. 3 shows a test data sequence for testing the dual port RAM according to the state of the art as shown in FIG. 2. The table FIG. 3 shows 16 iteration steps i for applying a four bit test address A (i).

A disadvantage of the embedded testing circuit according to the state of the art as described in U.S. Pat. No. 5,579,322 as shown in FIG. 2 applying the test data sequence as shown in FIG. 3 is, that the dual port memory RAM is not tested in a worst case scenario, i. e. at a worst possible operating frequency. The worst operation scenario for a dual port memory is fulfilled if three conditions are met simultaneously. Because of the coupling capacitance between different memory cells which are arranged in rows and columns, the worst operation scenario resulting in the lowest operating frequency of the RAM is given, when a first condition is met, i. e. when at the same time the same columns from both ports, A, B are selected. As a second condition, two adjacent rows used in the memory cell array are activated simultaneously. And finally, as a third condition, the worst case scenario is fulfilled when at the same time an inverted test data pattern is generated for both ports, A, B.

By the embedded testing circuit according to the state of the art as described in U.S. Pat. No. 5,579,322 testing is not performed for adjacent rows and memory cells at any time. For instance, when proceeding from the iteration step 1 to the iteration step 2, as shown in the table of FIG. 3, the applied address is changed from "1000" to "1100". In iteration step 1 the address applied to port A is "1000" and the address applied to port B is the inverted bit pattern "0111" so that in this iteration step adjacent rows in the memory cell array are addressed. However, in iteration step 2, the address applied to port A is "1100" and the address applied to port B is the inverted bit pattern "0011" addressing distant rows in the memory cell array. Accordingly, in iteration step 2, the memory cells are not adjacent, i. e. distant rows are addressed and tested. Therefore, the embedded testing circuit of U.S. Pat. No. 5,579,322 is not testing a functionality of the dual port RAM at the slowest possible operating frequency.

Accordingly, it is an object of the present invention to provide an embedded testing circuit for testing the functionality of a dual port RAM at its lowest possible operating frequency as well as a method for testing such a dual port memory.

SUMMARY OF THE INVENTION

The above given object is achieved by an embedded testing circuit for testing a dual port memory having a memory cell array being accessible through a first port and a second port, said embedded testing comprising:

an embedded address generation circuit for generating an internal address consisting of an internal row selection address ($RSA_{int}$) and an internal column selection address ($CSA_{int}$) in response to an external address consisting of an external row selection address ($RSA_{ext}$) and an external column selection address ($CSA_{ext}$), wherein said internal row selection address ($RSA_{int}$) for addressing a second row of said memory cell array through said second port (B) is generated by an adder which increments the external row selection address ($RSA_{ext}$) for addressing a first row of said memory cell array through said first port (A), such that the first row and said second row form adjacent rows within said memory cell array, wherein said internal column selection address ($CSA_{int}$) for addressing columns of said memory cell array through said second port (B) is switchable to be identical to said external column selection address ($CSA_{ext}$), and an embedded data generation circuit for generating an internal test data pattern in response to an external test data pattern, wherein said external test data pattern for accessing said memory cell array through said first port (A) is switchable to be inverted by an inverter when said memory cell array is accessed through said second port (B).

In a preferred embodiment of the embedded testing circuit according to the present invention, the adder for incrementing and the external row selection address comprises for each bit of said row selection address a corresponding adding element.

In a preferred embodiment of the embedded testing circuit according to the present invention, for an external address having n bits consisting of m external column selection bits and (n - m) external row selection bits, the adder comprises (n - m) adding elements wherein each adding element is provided for a corresponding external row selection bit of said external address.

In a preferred embodiment of the embedded testing circuit according to the present invention, the first element of the adder provided for the first row selection bit is formed by an inverting circuit, a second to penultimate adding element of said adder provided for the second to penultimate row selection bits are formed by logic units; and a last adding element of said adder provided for the last row selection bit is formed by an EXOR-gate logic.

In a preferred embodiment of the embedded testing circuit according to the present invention, each logic of said adder comprises an AND-gate for a logical AND-combination of the corresponding external row selection unit with an output of an AND-gate of a preceding logic unit of the adder; and an EXOR-gate for a logical EXOR-combination of the corresponding external row selection bit with the output of the AND-gate of the preceding logic unit to generate a corresponding internal row selection bit for addressing said memory cell array.

In a preferred embodiment of the embedded testing circuit according to the present invention, said embedded data generation circuit comprises for each generated internal row selection bit a data bit multiplexer which is switchable in response to an external select control signal between a first input to which said generated internal row selection bit is applied by an adding element of said adder, and a second input to which a separate external data bit for accessing said memory cell array through said second port is applied.

In a preferred embodiment of the embedded testing circuit according to the present invention, said embedded address generation circuit comprises for each bit of said m external column selection bit of said external column selection address an address bit multiplexer which is switchable in response to an external selection control signal between a first input to which said external column selection bit for addressing a column of said memory cell through said first port is applied, and a second input to which a separate external data bit for accessing said memory cell array through said second port is applied.

In a preferred embodiment of the embedded testing circuit according to the present invention, the dual port memory is formed by a random access memory.

In a preferred embodiment of the embedded testing circuit according to the present invention, the random access memory is a static random access memory (SRAM).

In a preferred embodiment of the embedded testing circuit according to the present invention, the first port and the second port is selected in response to a port selection control signal.

In a preferred embodiment of the embedded testing circuit according to the present invention, the first port is clocked by a first external clock signal, and the second port is clocked by a second external clock signal.

In a preferred embodiment of the embedded testing circuit according to the present invention, an operation of said first port is controlled in response to a first external read/write enable control signal.

The invention further provides a testing system for testing dual port memories each having a memory cell array being accessible by a first port and a second port, said testing system comprises:

an external tester for generating an external test address and an external test data pattern;

at least one dual port memory array which includes an embedded testing circuit having:

an embedded address generation circuit for generating an internal address consisting of an internal row selection address ($RSA_{int}$) and an internal column selection address ($CSA_{int}$) in response to an external address consisting of an external row selection address ($RSA_{ext}$) and an external column selection address ($CSA_{ext}$), wherein said internal row selection address ($RSA_{int}$) for addressing a second row of said memory cell array through said second port (B) is generated by an adder which increments the external row selection address ($RSA_{ext}$) for addressing a first row of said memory cell array through said first port (A), such that the first row and said second row form adjacent rows within said memory cell array, wherein said internal column selection address ($CSA_{int}$) for addressing columns of said memory cell array through said second port (B) is switchable to be identical to said external column selection address ($CSA_{ext}$); and an embedded data generation circuit for generating an internal test data pattern in response to said external test data pattern, wherein said external test data pattern for accessing said memory cell array through said first port (A) is switchable to be inverted by an inverter, when said memory cell array is accessed through said second port (B).

In a preferred embodiment of the testing system according to the present invention, the external tester is connected to the at least one dual port memory via an address bus to apply said external test address to said dual port memories and via a data bus to exchange data with the addressed dual port memory.

In a preferred embodiment of the testing system according to the present invention, the external tester is connected to the dual port memories via a first clock line to apply a first clock signal for the first port of said dual port memory, and via a second clock line to apply a second clock signal for the second port of said dual port memory.

In a preferred embodiment of the testing system according to the present invention, the tester is connected to the dual line memory via a first selection control line to apply a first selection control signal to select the first port of the dual line memory, and via a second selection control line to apply a second selection control signal to select the second port of the dual line memory.

In a preferred embodiment of the testing system according to the present invention, the tester is connected to said dual line memory via a first operation control line to apply a read/write enable control signal to the first port of said dual line memory, and via a second operation control line to apply a second read/write enable control signal to the second port of the dual line memory.

The invention further provides a method for testing a dual port memory having a memory cell array being accessible through a first port and a second port, wherein the method comprises the following steps:

generating an internal address consisting of an internal row selection address ($RSA_{int}$) and an internal column selection address ($CSA_{int}$) in response to an external address consisting of an external row selection address ($RSA_{ext}$) and an external column selection address ($CSA_{ext}$), wherein said internal row selection address ($RSA_{int}$) for addressing a second row of said memory cell array through said second port (B) is generated by incrementing the external row selection address ($RSA_{ext}$) for addressing a first row of said memory cell array through said first port (A), such that said first row and said second row form adjacent rows of said memory cell array, wherein said internal column selection address ($CSA_{int}$) for addressing columns of said memory cell array through said second port (B) is formed to be identical to said external column selection address ($CSA_{ext}$), and generating an internal test data pattern is response to an external test data pattern, wherein said external test data pattern for accessing said memory cell array through said first port (A) is inverted when said memory cell array is accessed through said second port (B).

BRIEF DESCRIPTION OF THE DRAWINGS

FIG. 3 shows a table for illustrating testing with the conventional embedded testing circuit according to the prior art as shown in FIG. 2;

FIG. 6C shows a part of the embedded testing circuit for testing a dual port memory according to a preferred embodiment of the present invention.

DETAILED DESCRIPTION OF THE PREFERRED EMBODIMENTS

Preferred embodiments of the present invention will be described below in detail with reference to the accompanying drawings.

Figure 1:
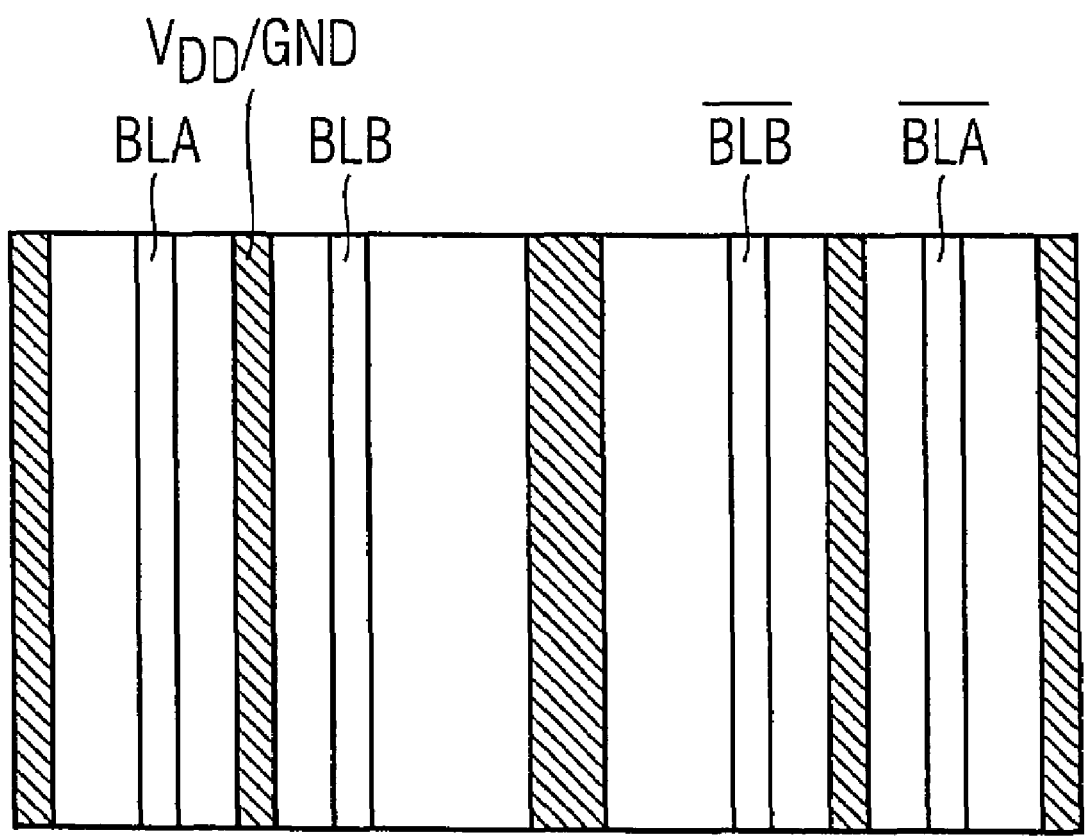
FIG. 1 shows the memory cell array of a conventional dual port memory.
Figure 2:
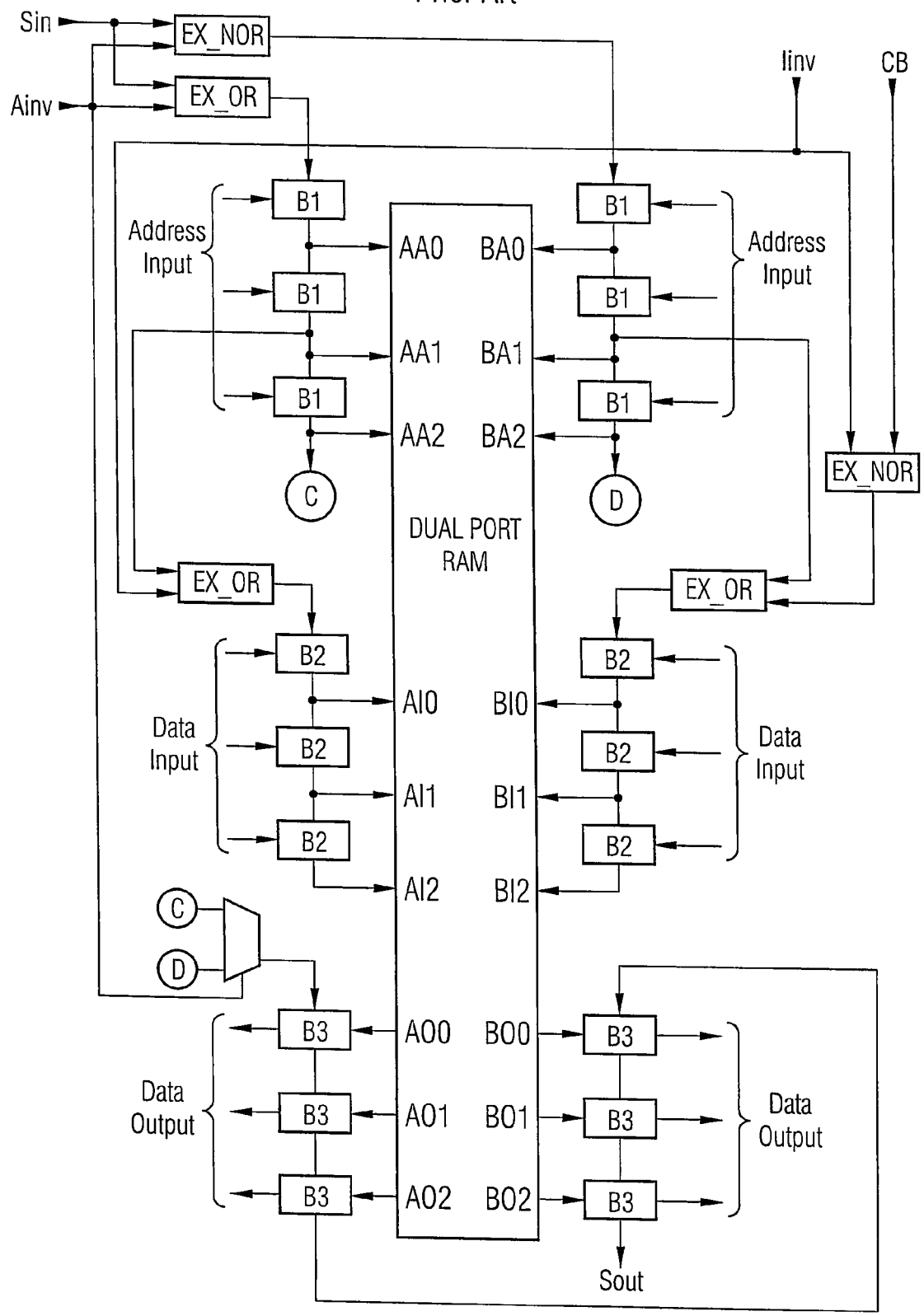
FIG. 2 shows an embedded testing circuit according to the state of the art.
Figure 4:
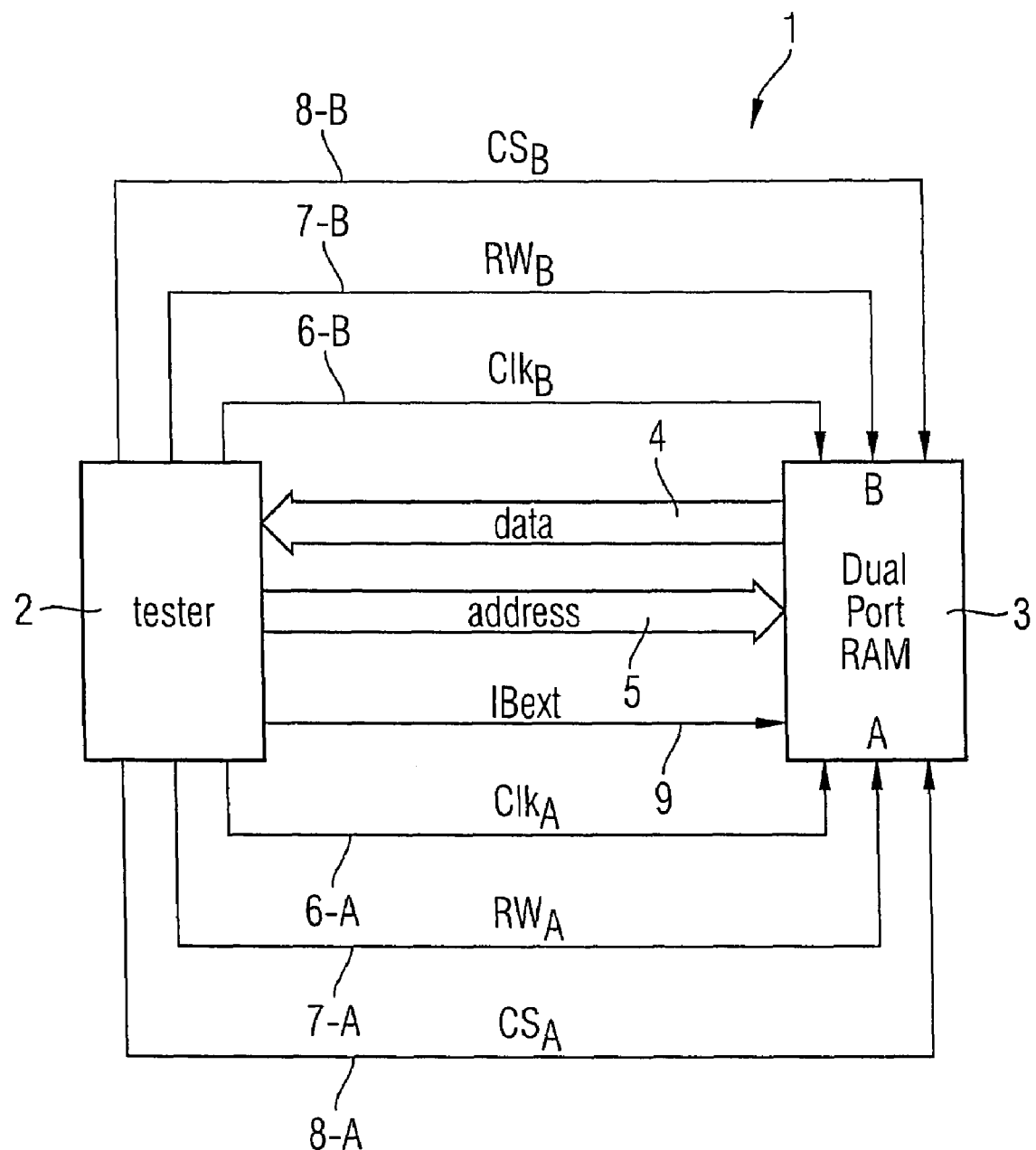
FIG. 4 shows a block diagram of an embodiment of the testing system according to the present invention.

FIG. 4 is a block diagram of a preferred embodiment of a testing system 1 according to the present invention for testing dual port memories. The testing system 1 comprises a tester 2 for testing at least one dual port memory 3. In the embodiment shown in FIG. 4, the tester 2 is provided for testing a single dual port memory 3, however, in alternative embodiments, the tester 2 is provided for testing several dual port memories 3 connected in parallel to the tester 2. The tester 2 is connected to the at least one dual port memory 3 via a bi-directional data bus 4 to exchange data with the addressed dual port memories, and via an address bus 5 to apply external test addresses to the at least one dual port memory 3. Furthermore, the external tester 2 is connected to the dual port memory 3 via a first clock line 6-A to apply a first clock signal $CLK_A$ for the first port A of the dual port memory 3, and via a second clock line 6-B to apply a second clock signal $CLK_B$ for the second port B of the dual port memory 3. The external tester 2 is connected to the dual line memory via a first operation control line 7-A to apply a read/write enable control signal to the first port A of the dual line memory 3, and via a second operation control line 7-B to apply a second read/write enable control signal to the second port B of the dual line memory 3. Furthermore, the external tester 2 is connected to the dual line memory 3 via a first selection control line 8-A to apply a first selection control signal CSA to select the first port A of the dual line memory 3, and via a second selection control line 8-B to apply a second selection control signal CSB to select the second port B of the dual line memory 3.

Figure 5:
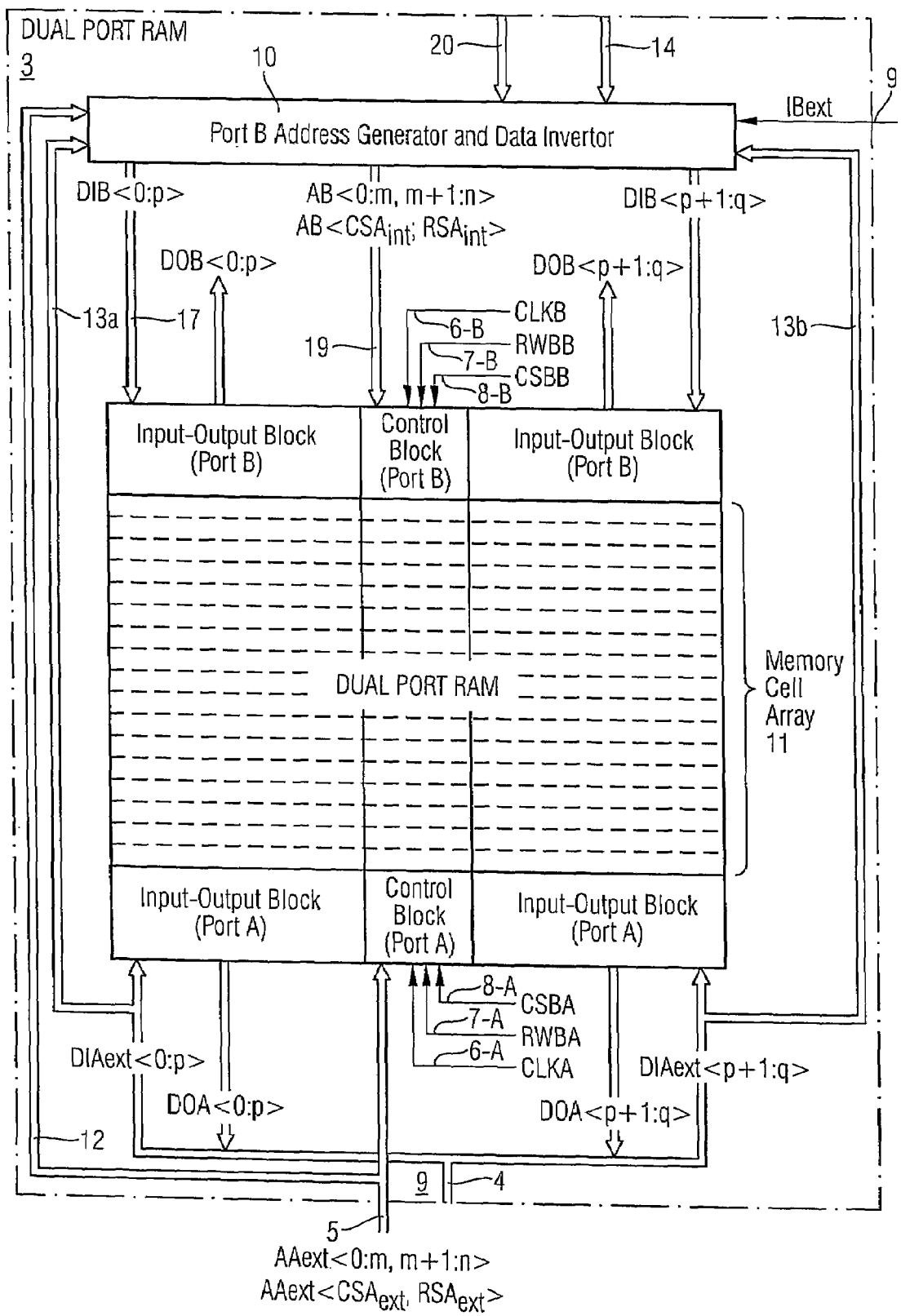
FIG. 5 shows a block diagram of an embodiment of the embedded testing circuit according to the present invention.

The tester 2 applies a switch control signal $IB_{ext}$ to the dual port RAM 3 via a control line 9. In a first state of the switch control signal $IB_{ext}$, the input address of the dual port RAM 3 is controlled by the external tester 2 and in a second state of the switch control signal $IB_{ext}$, the input address to the dual port RAM 3 is controlled by an embedded testing circuit 10 as shown in FIG. 5. When the external tester 2 complies the input address to the dual port RAM 3, it is possible to read a memory cell from both ports A, B simultaneously by keeping the input address the same for the two ports A, B.

FIG. 5 shows a preferred embodiment of an embedded testing circuit 10 provided to the dual line port RAM 3. The dual port memory 3 is accessible through a first port A and a second port B.

Figure 6A:
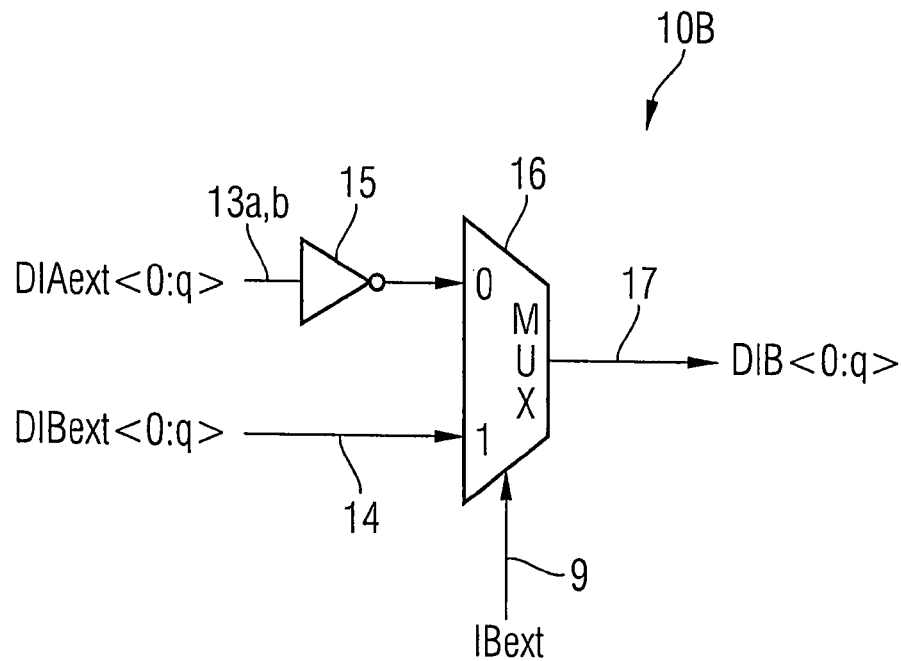
FIG. 6A shows an embedded data generation circuit forming a part of the embedded testing circuit according to a preferred embodiment of the present invention.
Figure 6B:
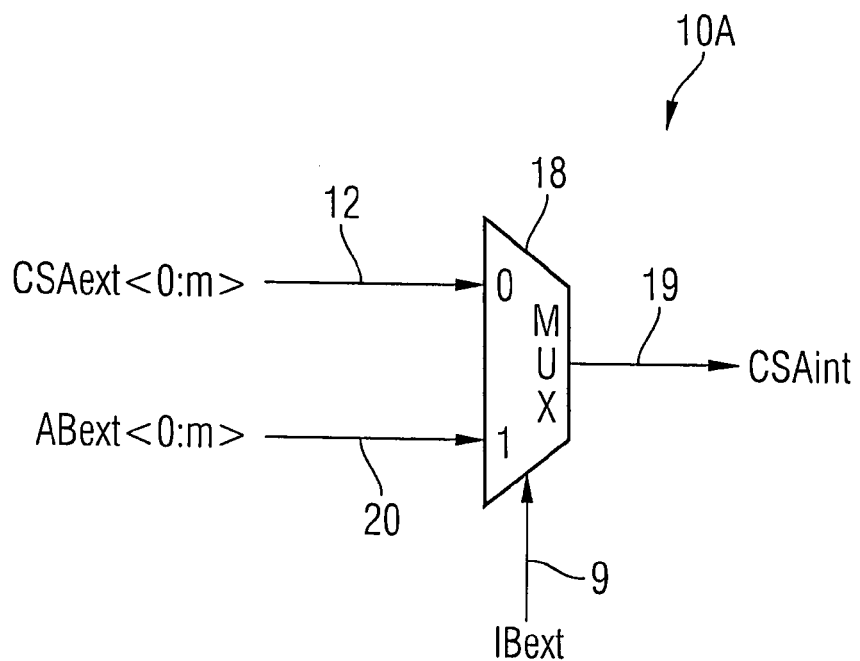
FIG. 6B shows a part of the embedded testing circuit according to a preferred embodiment of the present invention.

The embedded testing circuit 10 is in a preferred embodiment integrated within the dual port RAM 3. FIGS. 6A, 6B, 6C show a preferred embodiment of the embedded testing circuit 10 in more detail. The dual port RAM 3 further comprises a memory cell array 11 which is accessible via port A and port B. For each port A, B an input/output block and a control block is provided. The bi-directional data bus 4 is directly connected to the input/output data block of port A as shown in FIG. 5. In the embodiment as shown in FIG. 5, the dual port RAM is segmented in two symmetrical parts wherein the first segment has p columns and the other segment has q-p columns. The control blocks for both ports A, B are located in a central position. The input/output block of both ports A, B are placed on one side of the memory cell array 11 to supply input data DIA and DIB for writing through port A and port B, respectively, into the memory cell array 11. Furthermore, the input/output blocks are provided to output data DOA and DOB from both ports, A, B for reading contents of the memory cell array 11.

The external address applied by said tester 2 via an address bus 5 to the dual port RAM 3 consists of an external column selection address $CSA_{ext}$ and an external row selection address $RSA_{ext}$. An address bus <0:m> which forms part of the address bus 5 is provided for the external column selection address $CSA_{ext}$ and an address bus <m+1:n> forming part of the address bus 5 is provided for the external row selection address $RSA_{ext}$. Accordingly, the test address supplied by the external tester 2 to the dual port memory 3 is split in two parts wherein a first part is formed by column selection address bits, and a second part is formed by row selection address bits. The applied external address pattern is supplied via an internal address bus 12 to the embedded testing circuit 10. The data bus 4 is split internally in two internal data buses 13a, 13b being provided for the two segments of the memory cell array 11, wherein a first internal data bus 13a has the bus width of p bits, and the second internal data bus 13b has a bus width of q-p bits. Both internal data buses 13a, 13b are also connected to the embedded testing circuit 10. The embedded testing circuit 10 according to a preferred embodiment of the present invention comprises an embedded address generation circuit 10A and an embedded data generation circuit 10B.

The embedded address generation circuit 10A is shown in more detail with reference to FIGS. 6B, 6C. The embedded data generation circuit 10B is shown with reference to FIG. 6A.

The embedded data generation circuit 10B as shown in FIG. 6A is provided for generating an internal test data pattern in response to an external test data pattern applied to the dual port memory 3 via the external data bus 4. As can be seen from FIG. 6A, for each bit line of the internal data bus 13, an inverter 15 is provided for inverting the applied data bit. A multiplexer 16 is controlled by the external switch control signal $IB_{ext}$ to be applied via a control line 9 to output either the inverted test data pattern generated by inverting the test data pattern supplied to port A, or a separate external test data pattern applied by the external tester 2 via a separate internal data bus 14. In an alternative embodiment, only the converter circuit 15A is provided for inverting the test data pattern applied to port A without the provision of a multiplexer 16 and a further internal data bus 14. As can be seen from FIG. 6A, the internal test data pattern for accessing the cell memory array 11 through the first port A is switchable in response to the switch control signal $IB_{ext}$ to be inverted by the inverters 15 when the memory cell array 11 is accessed through the second port B.

FIG. 6B shows a further multiplexer 18 within the embedded testing circuit 10. The column select address bits are applied via the internal address bus 12 to a first input of the multiplexer 18 which is switched in response to the external control signal $IB_{ext}$. In the embodiment shown in FIG. 6B, the multiplexer 18 has a second input to which a separate external address is applied via a separate internal address bus 20. The internal column selection address $CSA_{int}$ for addressing a column of the memory cell array 11 through the second port B is switchable by means of the multiplexer to be identical to the external column selection address $CSA_{ext}$ applied via an internal address bus 12 or to a separate exernal column selection address applied by tester 2 via a separate internal address bus 20. The internal column selection address $CSA_{int}$ is forwarded to the control block of port B along with a generated internal row selection address $RSA_{int}$ via an internal address bus 19 as shown in FIG. 5.

FIG. 6C shows a preferred embodiment of a further part of the embedded address generation circuit 10A within the embedded testing circuit 10 as shown in FIG. 5. The circuit shown in FIG. 6C is an adder wherein the internal row selection address $RSA_{int}$ for addressing the second row of a memory cell array 11 through the second port B is generated by the adder which increments the external row selection address $RSA_{ext}$ for addressing a first row of the memory cell array 11 through the first port A by one such that the first row and the second row form adjacent rows within the memory cell array 11. Accordingly, the internal row selection address $RSA_{int}$ addressing a second row of the memory cell array 11 through the second port B is always adjacent to a row for addressing the same memory cell array 11 through a first port A so that the memory cell array 11 is tested in a worst case scenario at its lowest operation frequency. When the external address has n bits consisting of m external column selection bits and n - m external row selection bits, the adder as shown in FIG. 6C comprises n - m adding elements 20 wherein each adding element 20 is provided for a corresponding external row selection bit or the external address. As can be seen from FIG. 6C, the adding element 20 of the adder are arranged in a cascade. A first adding element of the adder provided for the first row selection bit m+1 is formed by an inverting circuit. The second to the penultimate adding elements of the adder provided for the second to penultimate row selection bits are formed by logic units each having an EXOR-gate and an AND-gate. The AND-gate is provided for forming a logical AND-operation of the corresponding external row selection bit with an output signal of the AND-gate of the preceding logic unit of the adder. The EXOR-gate is provided for performing a logical EXOR-operation of the corresponding external row selection bit with the output of the AND-gate of the preceding logic unit to generate a corresponding internal row selection bit for addressing the memory cell array 11. The embedded address generation circuit 10A as shown in FIG. 6C comprises for each generated internal row selection bit an address bit multiplexer 21 which is switchable in response to an external switch control signal $IB_{ext}$ between a first input to which said generated internal row selection bit is applied by the adding element, and a second input to which a separate external address bit for accessing said memory cell array 11 through the second port B is applied.

The dual port memory 3 as shown in FIG. 5 is a static random access memory SRAM. The first port A and the second port B are selected in response to a port selection control signal CSBA, CSBB applied via control lines 8-A, 8-B by the external tester 2. First port A is clocked by a first external clock signal CLK applied via clock line 6-A, and the second port B is clocked by a second external clock signal CLKB applied via a second clock line 6-B. An operation of the first port A is controlled in response to a first external read/write enable control signal RWA applied via a control line 7-A, and the operation of the second port B is controlled in response to a second external read/write enable control signal RWB applied via a control line 7-B.

The embedded testing circuit 10 according to the present invention generates an internal row selection address and keeps the column selection address identical for both ports A, B to ensure that the operation is performed in the same column of the memory cell array 11 from both ports A, B simultaneously. The read/write operation is performed in adjacent rows to incorporate the effect of simultaneous switching of adjacent memory cells, thus, simulating a worst case scenario. With the embedded testing circuit 10 according to the present invention, it is possible to test dual port memories 3 in the same manner as a single port memory. The generation of an address and data pattern within a dual port memory device makes testing of the dual port memory quite similar to testing of a single port memory, thus, facilitating the testing of the dual port memory.

What is claimed is:

1. Embedded testing circuit for testing a dual port memory having a memory cell array being accessible through a first port and a second port, said embedded testing circuit comprising:
   (a) an embedded address generation circuit for generating an internal address consisting of an internal row selection address and an internal column selection address in response to an external address consisting of an external row selection address and an external column selection address,
   (a1) wherein said internal row selection address for addressing a second row of said memory cell array through said second port is generated by an adder which increments the external row selection address for addressing a first row of said memory cell array through said first port, such that the first row and said second row form adjacent rows within said memory cell array,
   (a2) wherein said internal column selection address for addressing columns of said memory cell array through said second port is switchable to be identical to said external column selection address; and
   (b) an embedded data generation circuit for generating an internal test data pattern in response to an external test data pattern,
wherein said external test data pattern for accessing said memory cell array through said first port is switchable to be inverted by an inverter when said memory cell array is accessed through said second port.

2. The embedded testing circuit according to claim 1, wherein said adder for incrementing said external row selection address comprises for each bit of said row selection address a corresponding adding element.

3. The embedded testing circuit according to claim 2, wherein for an external address having n bits consisting of m external column selection bits and external row selection bits, the adder comprises adding elements wherein each adding element is provided for a corresponding external row selection bit of said external address.

4. The embedded testing circuit according to claim 3, wherein a first adding element of said adder provided for the first row selection bit is formed by an inverting circuit;
   second to penultimate adding elements of said adders provided for the second to penultimate row selection bits are formed by logic units; and
   a last adding element of said adder provided for the last row selection bit is formed by an EXOR-gate logic.

5. The embedded testing circuit according to claim 4, wherein each logic unit of said adder comprises an AND-gate for a logical AND-combination of the corresponding external row selection bit with an output of an AND-gate of a preceding logic unit of the adder; and
   an EXOR-gate for a logical EXOR-combination of the corresponding external row selection bit with the output of the AND-gate of the preceding logic unit to generate a corresponding internal row selection bit for addressing said memory cell array.

6. The embedded testing circuit according to claim 5, wherein said embedded address generation circuit comprises for each generated internal row selection bit a address bit multiplexer which is switchable in response to an external switch control signal between a first input to which said generated internal row selection bit is applied by an adding element of said adder and a second input to which a separate external address bit for accessing said memory cell array through said second port is applied.

7. The embedded testing circuit according to claim 1, wherein said embedded address generation circuit comprises for each bit of said m external column selection bits of said external column selection address an address bit multiplexer which is switchable in response to an external selection control signal between a first input to which said external column selection bit for addressing a column of said memory cell array through said first port is applied and a second input to which a separate external address bit for accessing said memory cell array through said second port is applied.

8. The embedded testing circuit according to claim 1, wherein said dual port memory is a random access memory.

9. The embedded testing circuit according to claim 8, wherein the random access memory is a static random access memory.

10. The embedded testing circuit according to claim 1, wherein said first port and said second port is selected in response to a port selection control signal.

11. The embedded testing circuit according to claim 1, wherein said first port is clocked by a first external clock signal and said second port is clocked by a second external clock signal.

12. The embedded testing circuit according to claim 1, wherein an operation of said first port is controlled in response to a first external read/write enable control signal and an operation of said second port is controlled in response to a second external read/write enable control signal.

13. A testing system for testing dual port memories each having a memory cell array being accessible by a first port and a second port, said testing system comprising:
   (a) an external tester for generating an external test address and an external test data pattern;
   (b) at least one dual port memory which includes an embedded testing circuit having:
   (b1) an embedded address generation circuit for generating an internal address consisting of an internal row selection address and an internal column selection address in response to an external address consisting of an external row selection address and an external column selection address,
   (b2) wherein said internal row selection address for addressing a second row of said memory cell array through said second port is generated by an adder which increments the external row selection address for addressing a first row of said memory cell array through said first port, such that the first row and said second row form adjacent rows within said memory cell array, (b3) wherein said internal column selection address for addressing columns of said memory cell array through said second port is switchable to be identical to said external column selection address; and (c) an embedded data generation circuit for generating an internal test data pattern in response to said external test data pattern, wherein said external test data pattern for accessing said memory cell array through said first port is switchable to be inverted by an inverter, when said memory cell array is accessed through said second port.

14. The testing system according to claim 13, wherein said external tester is connected to said at least one dual port memory via an address bus to apply said external test address to said dual port memories and via a data bus to exchange data with the addressed dual port memory.

15. The testing system according to claim 13, wherein said external tester is connected to said dual port memories via a first clock line to apply a first clock signal for the first port of said dual port memory and via a second clock line to apply a second clock signal for the second port of said dual port memory.

16. The testing system according to claim 13, wherein said external tester is connected to said dual port memory via a first selection control line to apply a first selection control signal to select said first port of said dual port memory and via a second selection control line to apply a second selection control signal to select said second port of said dual port memory.

17. The testing system according to claim 13, wherein said external tester is connected to said dual port memory via a first operation control line to apply a read/write enable control signal to said first port of said dual port memory and via a second operation control line to apply a second read/write enable control signal to said second port of said dual port memory.

18. A method for testing a dual port memory having a memory cell array being accessible through a first port and a second port, wherein the method comprises the following steps:

(a) generating an internal address consisting of an internal row selection address and an internal column selection address in response to an external address consisting of an external row selection address and an external column selection address, wherein said internal row selection address for addressing a second row of said memory cell array through said second port is generated by incrementing the external row selection address for addressing a first row of said memory cell array through said first port, such that said first row and said second row form adjacent rows of said memory cell array, (b) wherein said internal column selection address for addressing columns of said memory cell array through said second port is formed to be identical to said external column selection address, and (c) generating an internal test data pattern is response to an external test data pattern, wherein said external test data pattern for accessing said memory cell array through said first port is inverted when said memory cell array is accessed through said second port.

* * * * *